United States Patent
Tsai

(10) Patent No.: US 12,386,264 B2
(45) Date of Patent: Aug. 12, 2025

(54) METHODS TO IMPROVE PROCESS WINDOW AND RESOLUTION FOR DIGITAL LITHOGRAPHY WITH TWO EXPOSURES

(71) Applicant: Applied Materials, Inc., Santa Clara, CA (US)

(72) Inventor: Chi-Ming Tsai, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 84 days.

(21) Appl. No.: 18/006,249

(22) PCT Filed: Sep. 9, 2021

(86) PCT No.: PCT/US2021/049568
§ 371 (c)(1),
(2) Date: Jan. 20, 2023

(87) PCT Pub. No.: WO2022/060616
PCT Pub. Date: Mar. 24, 2022

(65) Prior Publication Data
US 2023/0288812 A1    Sep. 14, 2023

Related U.S. Application Data

(60) Provisional application No. 63/080,307, filed on Sep. 18, 2020.

(51) Int. Cl.
*G03F 7/20*    (2006.01)
*G03F 7/00*    (2006.01)

(52) U.S. Cl.
CPC ........ *G03F 7/2051* (2013.01); *G03F 7/70466* (2013.01); *G03F 7/70508* (2013.01); *G03F 7/70725* (2013.01)

(58) Field of Classification Search
CPC .. G03F 7/2051; G03F 7/2057; G03F 7/70466; G03F 7/70291; G03F 7/70433; G03F 7/70508
See application file for complete search history.

(56) References Cited

U.S. PATENT DOCUMENTS

| 5,936,713 A | * | 8/1999 | Paufler | G03F 7/70466 |
| | | | | 355/53 |
| 2001/0002304 A1 | * | 5/2001 | Pierrat | G03F 7/70441 |
| | | | | 430/30 |

(Continued)

FOREIGN PATENT DOCUMENTS

| JP | 2003195511 A | 7/2003 |
| JP | 2008292871 A | 12/2008 |

(Continued)

OTHER PUBLICATIONS

International Search Report/ Written Opinion issued to PCT/US2021/049568 on Dec. 21, 2021.

(Continued)

*Primary Examiner* — Steven H Whitesell
(74) *Attorney, Agent, or Firm* — Patterson + Sheridan, LLP

(57) ABSTRACT

Embodiments described herein relate to methods of printing double exposure patterns in a lithography environment. The methods include determining a second exposure pattern to be exposed with a first exposure pattern in a lithography process. The second exposure pattern is determined with a rule-based process flow or a lithography model process flow.

20 Claims, 9 Drawing Sheets

(56) References Cited

U.S. PATENT DOCUMENTS

| | | | |
|---|---|---|---|
| 2002/0091985 A1* | 7/2002 | Liebmann | G03F 1/36 716/53 |
| 2003/0124463 A1* | 7/2003 | Sekigawa | G03F 7/70466 430/394 |
| 2004/0170905 A1* | 9/2004 | Liebmann | G03F 1/36 716/55 |
| 2006/0246362 A1* | 11/2006 | Yasuzato | G03F 1/36 716/54 |
| 2006/0269116 A1* | 11/2006 | Makarovic | G03F 7/70508 382/141 |
| 2007/0153249 A1* | 7/2007 | Troost | G03F 7/70275 355/67 |
| 2007/0248899 A1 | 10/2007 | Choi | |
| 2009/0040485 A1* | 2/2009 | Okuyama | G03F 7/70508 355/53 |
| 2009/0087619 A1 | 4/2009 | Aton et al. | |
| 2009/0092926 A1* | 4/2009 | Gutmann | G03F 1/70 430/312 |
| 2012/0040280 A1* | 2/2012 | Agarwal | G03F 7/70466 430/30 |
| 2013/0295698 A1 | 11/2013 | Pforr et al. | |
| 2014/0045105 A1 | 2/2014 | Huang et al. | |
| 2017/0115556 A1* | 4/2017 | Shim | G03F 1/36 |
| 2018/0120709 A1 | 5/2018 | Hsu et al. | |
| 2019/0196323 A1 | 6/2019 | Jeong | |

FOREIGN PATENT DOCUMENTS

| | | |
|---|---|---|
| JP | 2011049296 A | 3/2011 |
| JP | 2017005189 A | 1/2017 |

OTHER PUBLICATIONS

Japanese Office Action issued to Patent Application No. 2023-517809 on Mar. 19, 2024.

Korean Office Action issued to application No. 10-2023-7012865 on Dec. 30, 2024.

* cited by examiner

METHODS TO IMPROVE PROCESS WINDOW AND RESOLUTION FOR DIGITAL LITHOGRAPHY WITH TWO EXPOSURES

BACKGROUND

Field

Embodiments of the present disclosure generally relate to lithography systems. More particularly, embodiments of the present disclosure relate to methods of printing double exposure patterns within a lithography environment.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels disposed between two plates. When power from a power supply is applied across the liquid crystal material, an amount of light passing through the liquid crystal material may be controlled at pixel locations enabling images to be generated.

Lithography techniques are generally employed to create electrical features incorporated as part of the liquid crystal material layer forming the pixels. Maskless lithography techniques involve creating a virtual mask, and selected portions of films are removed from the films to create patterns in films on substrates. However, as device sizes decreases, there remains a need for improved resolutions.

SUMMARY

In one embodiment, a method is provided. The method includes receiving data defining a first exposure pattern for a lithographic process. The first exposure pattern including one or more polygons. The method further includes determining a position and a width of a second exposure pattern based on the data defining the first exposure pattern and determining a pattern bias to be applied for the first exposure pattern during the lithographic process. The pattern bias of the first exposure pattern is determined based on the position and the width of the second exposure pattern. The method further includes converting the data of the first exposure pattern and the data indicating the pattern bias to a first virtual mask file and patterning a substrate using the first virtual mask file in a maskless lithography device. The method further includes converting the data of the second exposure pattern to a second virtual mask file and patterning the substrate in the maskless lithography device using the second virtual mask file.

In another embodiment, a method is provided. The method includes receiving data defining a first exposure pattern for a lithographic process. The first exposure pattern including one or more polygons. The method further includes inputting the data to a lithography model constructed to predict an aerial image and resist profile based on the data. The method further includes determining a position and a width of a second exposure pattern using numerical calculations to solve the lithography model, wherein the position and the width correspond to a maximum intensity log-slope (ILS) or depth-of-focus of features formed in a photoresist of a substrate based on the data. The method further includes determining a pattern bias to be applied for the first exposure pattern during the lithographic process, the pattern bias of the first exposure pattern determined using numerical calculations to solve the lithography model, wherein the pattern bias corresponds to a maximum ILS or depth-of-focus of the features formed in the photoresist of the substrate based on the data. The method further includes converting the data of the first exposure pattern and the data indicating the pattern bias to a first virtual mask file and patterning a substrate using the first virtual mask file in a maskless lithography device. The method further includes converting the data of the second exposure pattern to a second virtual mask file and patterning the substrate in the maskless lithography device using the second virtual mask file.

In yet another embodiment, a system is provided. The system includes a moveable stage configured to support a substrate having a photoresist disposed thereon and a processing unit disposed over the moveable stage configured to print a first virtual mask file and a second virtual mask file provided by a controller in communication with the processing unit. The controller is configured to receive data defining a first exposure pattern for a lithographic process. The first exposure pattern includes one or more polygons. The controller is further configured to determine a position and a width of a second exposure pattern based on the data defining the first exposure pattern and determine a pattern bias to be applied for the first exposure pattern during the lithographic process. The pattern bias of the first exposure pattern is determined based on the position and the width of the second exposure pattern. The controller is further configured to convert the data of the first exposure pattern and the data indicating the pattern bias to a first virtual mask file and pattern a substrate using the first virtual mask file with the processing unit. The controller is further configured to convert the data of the second exposure pattern to a second virtual mask file and pattern the substrate with the processing unit using the second virtual mask file.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
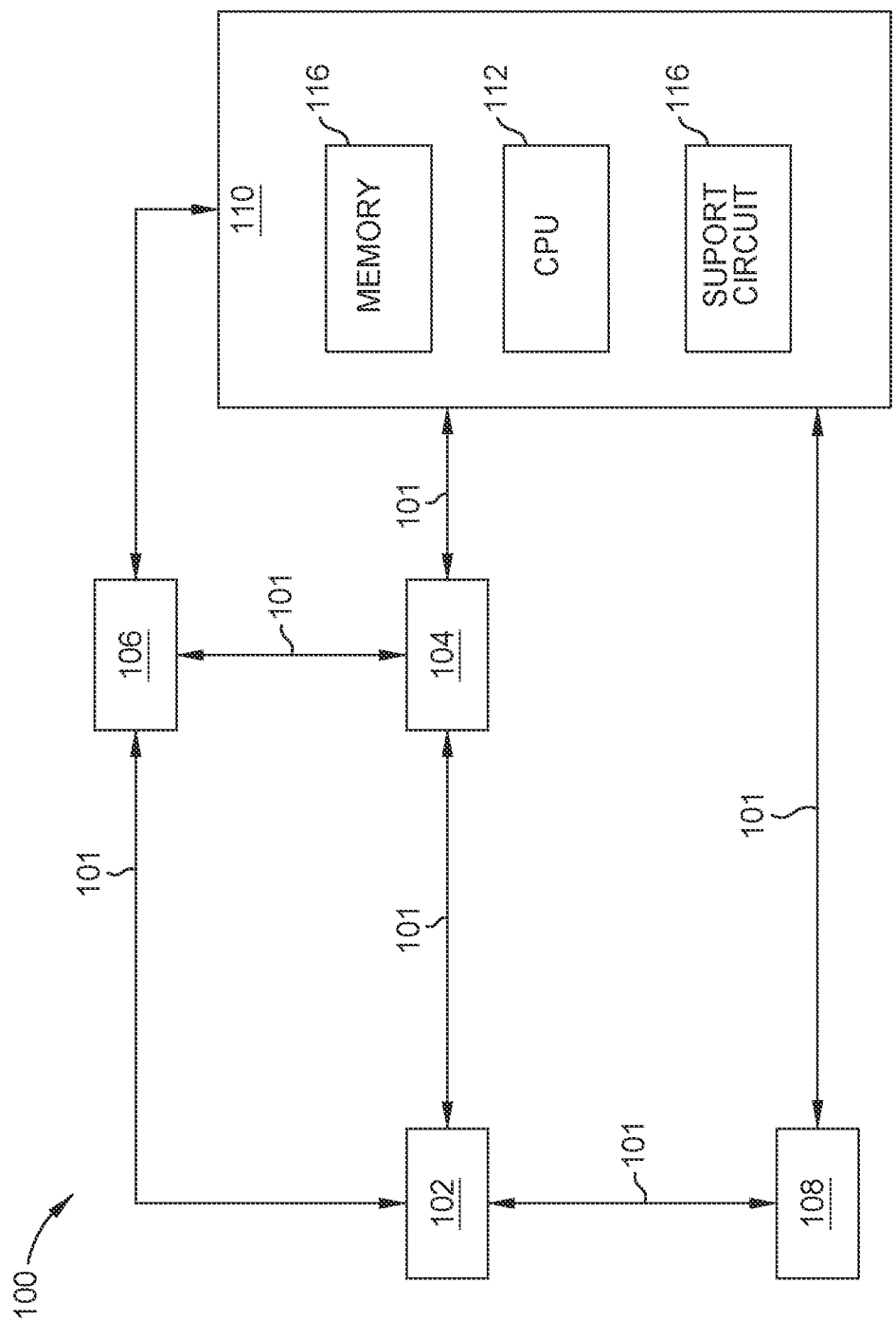
FIG. 1 is a schematic diagram of a lithography environment according to embodiments described herein.

Embodiments of the present disclosure generally relate to lithography systems. More particularly, embodiments of the present disclosure relate to methods of printing double exposure patterns within a lithography environment. The methods include determining a second exposure pattern to be exposed with a first exposure pattern in a lithography process. The second exposure pattern is determined with a rule-based process flow or a lithography model process flow.

In one embodiment, a method is provided. The method includes receiving data defining a first exposure pattern for a lithographic process. The first exposure pattern including one or more polygons. The method further includes determining a position and a width of a second exposure pattern based on the data defining the first exposure pattern and determining a pattern bias to be applied for the first exposure pattern during the lithographic process. The pattern bias of the first exposure pattern is determined based on the position and the width of the second exposure pattern. The method further includes converting the data of the first exposure pattern and the data indicating the pattern bias to a first virtual mask file and patterning a substrate using the first virtual mask file in a maskless lithography device. The method further includes converting the data of the second exposure pattern to a second virtual mask file and patterning the substrate in the maskless lithography device using the second virtual mask file.

In another embodiment, a method is provided. The method includes receiving data defining a first exposure pattern for a lithographic process. The first exposure pattern including one or more polygons. The method further includes inputting the data to a lithography model constructed to predict an aerial image and resist profile based on the data. The method further includes determining a position and a width of a second exposure pattern using numerical calculations to solve the lithography model, wherein the position and the width correspond to a maximum intensity log-slope (ILS) or depth-of-focus of features formed in a photoresist of a substrate based on the data. The method further includes determining a pattern bias to be applied for the first exposure pattern during the lithographic process, the pattern bias of the first exposure pattern determined using numerical calculations to solve the lithography model, wherein the pattern bias corresponds to a maximum ILS or depth-of-focus of the features formed in the photoresist of the substrate based on the data. The method further includes converting the data of the first exposure pattern and the data indicating the pattern bias to a first virtual mask file and patterning a substrate using the first virtual mask file in a maskless lithography device. The method further includes converting the data of the second exposure pattern to a second virtual mask file and patterning the substrate in the maskless lithography device using the second virtual mask file.

FIG. 1 is a schematic diagram of a lithography environment 100. As shown, the lithography environment 100 includes, but is not limited to, a maskless lithography device 108, a controller 110, and communication links 101. The controller 110 is operable to facilitate the transfer of a digital pattern file 104 (e.g., data) provided to the controller 110. The controller 110 is operable to execute a virtual mask software application 102 and a double exposure software application 106. Each of the lithography environment devices is operable to be connected to each other via the communication links 101. Each of the lithography environment devices is operable to be connected to the controller 110 by the communication links 101. The lithography environment 100 can be located in the same area or production facility, or the each of the lithography environment devices can be located in different areas.

Each of the plurality of lithography environment devices are additionally indexed with method 400 operations and method 600 operations described herein. In one embodiment, which can be combined with other embodiments described herein, each of the maskless lithography device 108 and the controller 110 include an on-board processor and memory, where the memory is configured to store instructions corresponding to any portion of the methods 400 and 600 described below. The communication links 101 may include at least one of wired connections, wireless connections, satellite connections, and the like. The communications links 101 facilitate sending and receiving files to store data, according to embodiments further described herein. Transfer of data along communications links 101 can include temporarily or permanently storing files or data in the cloud, before transferring or copying the files or data to a lithography environment device.

The controller 110 includes a central processing unit (CPU) 112, support circuits 114 and a memory 116. The CPU 112 can be one of any form of computer processor that can be used in an industrial setting for controlling the lithography environment devices. The memory 116 is coupled to the CPU 112. The memory 116 can be one or more of readily available memory, such as random access memory (RAM), read only memory (ROM), floppy disk, hard disk, or any other form of digital storage, local or remote. The support circuits 114 are coupled to the CPU 112 for supporting the processor. These circuits include cache, power supplies, clock circuits, input/output circuitry, subsystems, and the like. The controller 110 can include the CPU 112 that is coupled to input/output (I/O) devices found in the support circuits 114 and the memory 116. The controller 110 is operable to facilitate and transfer the digital pattern file 104 to the maskless lithography device 108 via the communication links 101. The digital pattern file 104 is operable to be provided to the virtual mask software application 102 or the maskless lithography device 108 via the controller 110.

The memory 116 can include one or more software applications, such as the virtual mask software application 102 and the double exposure software application 106. The memory 116 can also include stored media data that is used by the CPU 112 to perform the method 400 and 600 described herein. The CPU 112 can be a hardware unit or combination of hardware units capable of executing software applications and processing data. In some configurations, the CPU 112 includes a digital signal processor (DSP), an application-specific integrated circuit (ASIC), and/or a combination of such units. The CPU 112 is configured to execute the one or more software applications, such as the virtual mask software application 102 and the double exposure software application 106 and process the stored media data, which can be each included within the memory 116. The controller 110 controls the transfer of data and files to and from the various lithography environment devices. The memory 116 is also configured to store instructions corresponding to any operation of the method 400 or the method 600 according to embodiments described herein.

The controller 110 is operable to receive exposure patterns (shown in FIGS. 3A-3B) of the digital pattern file 104 and transfer the exposure patterns to the maskless lithography device 108 via the communication links 101. The controller 110 may also facilitates the control and automation of a digital lithography process based on the digital pattern file 104 provided by the double exposure software application 106. The digital pattern file 104 (or computer instructions), which may be referred to as an imaging design file, readable by the controller 110, determines which tasks are performable on a substrate. While the virtual mask software application 102 and the double exposure software application 106 are illustrated as separate from the controller 110 (e.g., in the cloud), it is contemplated that the virtual mask software application 102 and the double exposure software application 106 may be stored locally (e.g., in memory 116).

The digital pattern file 104 corresponds to a pattern to be written into the photoresist using electromagnetic radiation output by the maskless lithography device 108. In one embodiment, which can be combined with other embodiments described herein, the pattern may be formed with one or more patterning devices. For example, the one or more patterning devices are configured to perform ion-beam etching, reactive ion etching, electron-beam (e-beam) etching, wet etching, nanoimprint lithography (NIL), and combinations thereof. The digital pattern file 104 may be provided in different formats. For example, the format of the digital pattern file 104 may be one of a GDS format, and an OASIS format, among others. The digital pattern file 104 includes information corresponding to features of exposure patterns to be generated on a substrate (e.g., the substrate 220). The digital pattern file 104 may include areas of interest which correspond to one or more structural elements. The structural elements may be constructed as geometrical shapes (e.g., polygons).

The double exposure software application 106 is executable to refine and/or update the digital pattern file 104. In one embodiment, which can be combined with other embodiments described herein, the double exposure software application 106 is a software program stored in the memory 116 of the controller 110. The CPU 112 is configured to execute the software program. In another embodiment, which can be combined with other embodiments described herein, the double exposure software application 106 may be a remote computer server which includes a controller and a memory (e.g., data store).

The digital pattern file 104 is provided to the controller 110. The controller 110 applies the double exposure software application 106 to the digital pattern file 104. The double exposure software application 106 is operable to refine and update the exposure patterns of the digital pattern file 104. In one embodiment, which can be combined with other embodiments described herein, the double exposure software application 106 utilizes a rule-based algorithm. The rule-based algorithm utilizes a lookup table database to refine the exposure patterns of the digital pattern file 104. The rule-based algorithm references the lookup table database to determine a positon and a width of a second exposure pattern 306 (shown in FIGS. 3A and 3B) that maximizes an intensity log-slope (ILS) and depth-of-focus of features formed in a photoresist of a substrate based on the digital pattern file 104. The rule-based algorithm further references the lookup table database to determine a pattern bias to apply to the first exposure pattern 304 (shown in FIGS. 3A and 3B). The lookup table database includes empirical data relating to the biasing required to maintain desired dimensions for the first exposure pattern 304 (shown in FIGS. 3A and 3B) based on a positon and a width of a second exposure pattern 306 (shown in FIGS. 3A and 3B).

The rule-based algorithm is constructed empirically by designing a set of test exposure patterns and printing the test exposure patterns, and correlating tests with a resultant ILS value. The pattern bias may also be added to the test exposure pattern set as a variable. The test exposure pattern is printed and inspected. The results with the largest ILS and/or depth of focus, correct dimensions of the test feature set, and with no extra printed patterns, are added to the lookup table. Thus, the lookup table includes rows of data denoting the positon and width of the second exposure patterns to achieve the largest possible ILS and depth of focus (or other values, based on user-defined rules) based on the provided digital pattern file 104. In some examples, the software algorithms defined here in may not select the second exposure pattern with the absolute largest ILS value from the lookup table. Rather, the software algorithm may select the second exposure pattern with the largest ILS value that also meets any other predefined condition. In such an example, the software algorithm may select the second exposure pattern with the second, third, or other largest ILS value if other exposure patterns do not satisfy other rules of the algorithm.

Each row of the lookup table may correspond to one type of first exposure. For example, the lookup table may include a single row for a 1 μm width isolated exposure pattern, and another row for a 1 μm width exposure pattern with 3 μm polygon spacing between adjacent exposure patterns. Other examples, variables, and values are contemplated. It is contemplated that the lookup table and/or selection may be refined or updated in response to processing results.

In another embodiment, which can be combined with other embodiments described herein, the double exposure software application 106 utilizes a lithography model. The lithography model analyzes exposure patterns of the digital pattern file 104 to enlarge an intensity log-slope (ILS) and depth-of-focus of features formed in a photoresist of a substrate The lithography model is a physics based model. The lithography model may use either a scalar or vector imaging model. For example, the lithography model may utilize Transmission Cross Coefficients (TCC) which is a matrix defined by optical properties and/or photoresist properties. Other numerical simulation techniques such as Resolution Enhancement Technology (RET), Optical Proximity Correction (OPC), and Source Mask Optimization (SMO) may be utilized. However, all such models and modeling techniques, whether now known or later developed, are intended to be within the scope of the present disclosure. The lithography model is constructed to be defined based on optical properties (e.g., optical properties relating to the maskless lithography device 108) and the photoresist properties (e.g., properties of the photoresist of which the pattern will be printed on such as materials and processing characteristics of the photoresist). The photoresist properties include numerical aperture, exposure, illumination type, size of illumination, and wavelength, and may include other values.

Once the lithography model is constructed, the digital pattern file 104 is input to the lithography model. The lithography model then outputs a prediction of the aerial image and resist profile of the digital pattern file 104. Through post-processing operations, the ILS and depth of focus of features formed in a photoresist of a substrate based on the digital pattern file 104 may be determined. The lithography model will utilize numerical calculations to predict variables to achieve the maximum ILS and depth of focus (or a maximum ILS and depth of focus within other predefined constraints). The variables includes a width 318 and position 320 of the second exposure patterns 306 (shown in FIGS. 3A and 3B) and a pattern bias value of the first exposure patterns 304 (shown in FIG. 3B). The numerical calculations may be iterative methods, level-set methods, or any other numerical methods operable to solve the lithography model.

In one embodiment, the lithography model refines the digital pattern file 104 by iteratively adjusting variables of the digital pattern file 104. The variables include positon and width of a second exposure pattern 306 (shown in FIGS. 3A and 3B) and a bias of a first exposure pattern 304 (shown in FIGS. 3A and 3B). The variables are iteratively adjusted according to the lithography model or other rules of the double exposure software application 106 until a threshold intensity log-slope (ILS) and/or depth-of-focus of features are achieved. Additionally or alternatively, the double exposure software application 106 refines the digital pattern file 104 by iteratively adjusting the variables of the digital pattern file 104 according to an algorithm or other rules of the double exposure software application 106 until a maximum intensity log-slope (ILS) and/or depth-of-focus of features are achieved. The lithography model also ensures that the second exposure pattern 306 is confined within the first exposure pattern 304. The lithography model ensures that the bias is applied such that the first exposure pattern 304 is within tolerances of the desired pattern based on the digital pattern file 104.

The controller 110 provides the digital pattern file 104 to the virtual mask software application 102. The virtual mask software application 102 is operable to receive the digital pattern file 104 via the communication links 101. The virtual mask software application 102 can be a vMASC software. The digital pattern file 104 may be provided to the virtual mask software application 102 after updating the digital pattern file 104 with the double exposure software application 106. In one embodiment, which can be combined with other embodiments described herein, the virtual mask software application 102 is a software program stored in the memory 116 of the controller 110. The CPU 112 is configured to execute the software program. In another embodiment, which can be combined with other embodiments described herein, the virtual mask software application 102 may be a remote computer server which includes a controller and a memory (e.g., data store).

The digital pattern file 104 is converted into one or more virtual mask files by the virtual mask software application 102. For example, a first virtual mask file may correspond to the first exposure pattern and a second virtual mask file may correspond to the second exposure pattern. The virtual mask file is a digital representation of the design to be printed by the maskless lithography device 108. The virtual mask file is provided to the maskless lithography device 108 via the communication links 101. The virtual mask file is stored in the maskless lithography device 108.

Figure 2:
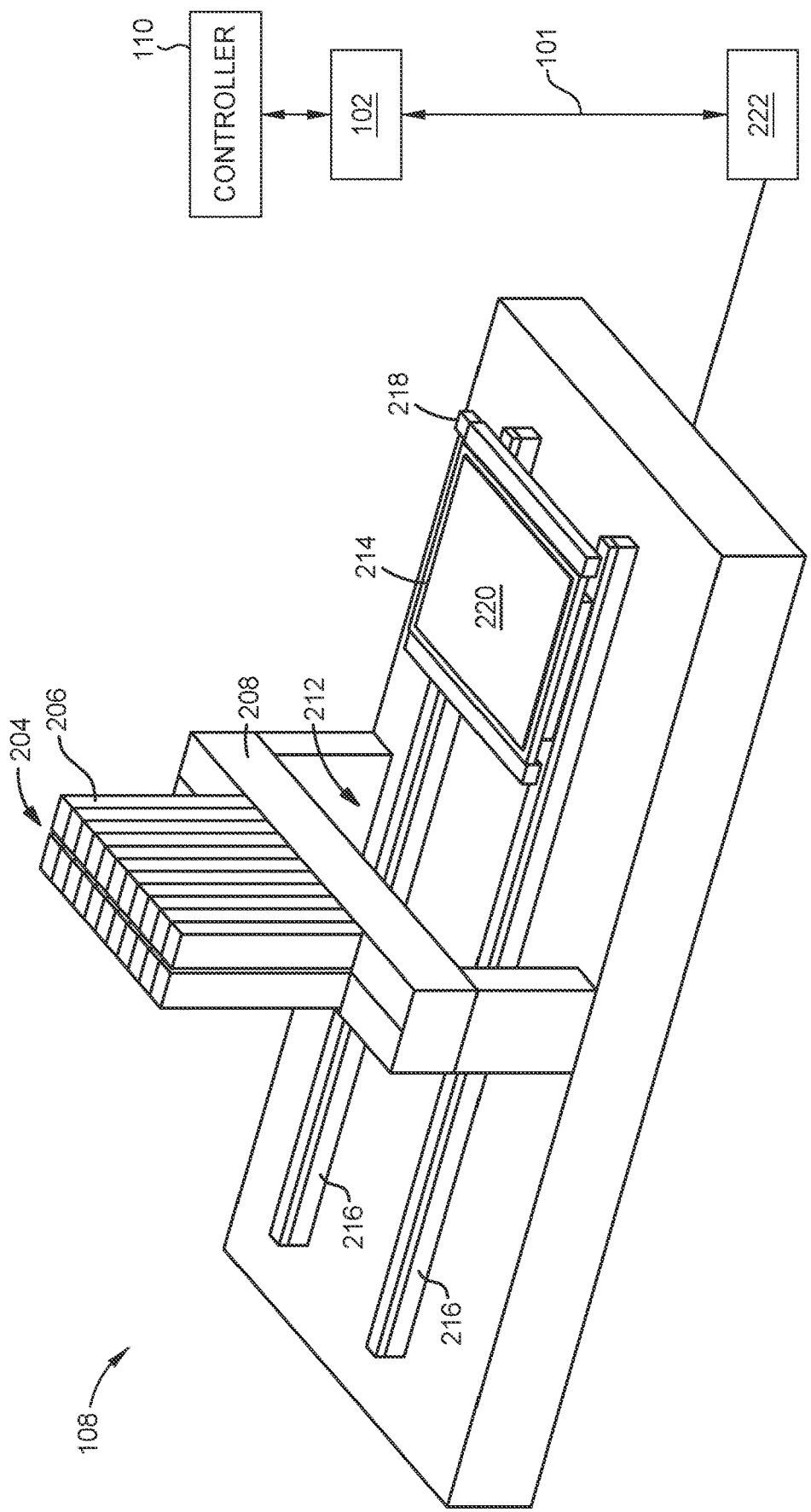
FIG. 2 is a perspective view of an exemplary maskless lithography device according to embodiments described herein.

FIG. 2 is a perspective view of an exemplary maskless lithography device 108. The maskless lithography device 108 includes a stage 214 and a processing unit 204. The stage 214 is supported by a pair of tracks 216. A substrate 220 is supported by the stage 214. The stage 214 is operable to move along the pair of tracks 216. An encoder 218 is coupled to the stage 214 in order to provide information of the location of the stage 214 to a lithography controller 222. The maskless lithography device 108 is in communication with a controller 110. The controller 110 is operable to deliver one or more virtual mask files corresponding to the first exposure pattern and the second exposure pattern, respectively, or the controller 110 is otherwise configured to perform processes described herein.

The lithography controller 222 is generally designed to facilitate the control and automation of the processing techniques described herein. The lithography controller 222 may be coupled to or in communication with the processing unit 204, the stage 214, and the encoder 218. The processing unit 204 and the encoder 218 may provide information to the lithography controller 222 regarding the substrate processing and the substrate aligning. For example, the processing unit 204 may provide information to the lithography controller 222 to alert the lithography controller 222 that substrate processing has been completed. The lithography controller 222 facilitates the control and automation of a maskless lithography process based on a virtual mask file provided by a virtual mask software application 102. The virtual mask file, readable by the lithography controller 222, determines which tasks are to be performed on a substrate. The virtual mask file corresponds to an exposure pattern to be written into the photoresist using the electromagnetic radiation.

The substrate 220 comprises any suitable material, for example, glass, which is used as part of a flat panel display. In other embodiments, which can be combined with other embodiments described herein, the substrate 220 is made of other materials capable of being used as a part of the flat panel display. The substrate 220 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. After exposure of the photoresist to the electromagnetic radiation, the resist is developed to leave an exposure underlying film layer. Then, using the patterned photoresist, the underlying thin film is pattern etched through the openings in the photoresist to form a portion of the electronic circuitry of the display panel.

The processing unit 204 is supported by the support 208 such that the processing unit 204 straddles the pair of tracks 216. The support 208 provides an opening 212 for the pair of tracks 216 and the stage 214 to pass under the processing unit 204. The processing unit 204 is a pattern generator configured to receive the virtual mask file from the virtual mask software application 102. The virtual mask file is provided to the processing unit 204 via the lithography controller 222. The processing unit 204 is configured to expose the photoresist in the maskless lithography process using one or more image projection systems 206. The one or more image projection systems 206 are operable to project write beams of electromagnetic radiation to the substrate 220. The exposure pattern generated by the processing unit 204 is projected by the image projection systems 206 to expose the photoresist of the substrate 220 to the exposure pattern. The exposure of the photoresist form one or more different features in the photoresist. In one embodiment, which can be combined with other embodiments described herein, each image projection system 206 includes a spatial light modulator to modulate the incoming light to create the desired image. Each spatial light modulator includes a plurality of electrically addressable elements that may be controlled individually. Each electrically addressable element may be in an "ON" position or an "OFF" position based on the digital pattern file 104 (shown in FIG. 1). When the light reaches the spatial light modulator, the electrically addressable elements that are in the "ON" position project a plurality of write beams to a projection lens (not shown). The projection lens then projects the write beams to the substrate 220. The electrically addressable elements include, but are not limited to, digital micromirrors, liquid crystal displays (LCDs), liquid crystal over silicon (LCoS) devices, ferroelectric liquid crystal on silicon (FLCoS) devices, microshutters, microLEDs, VCSELs, liquid crystal displays (LCDs), or any solid state emitter of electromagnetic radiation.

Figure 3A:
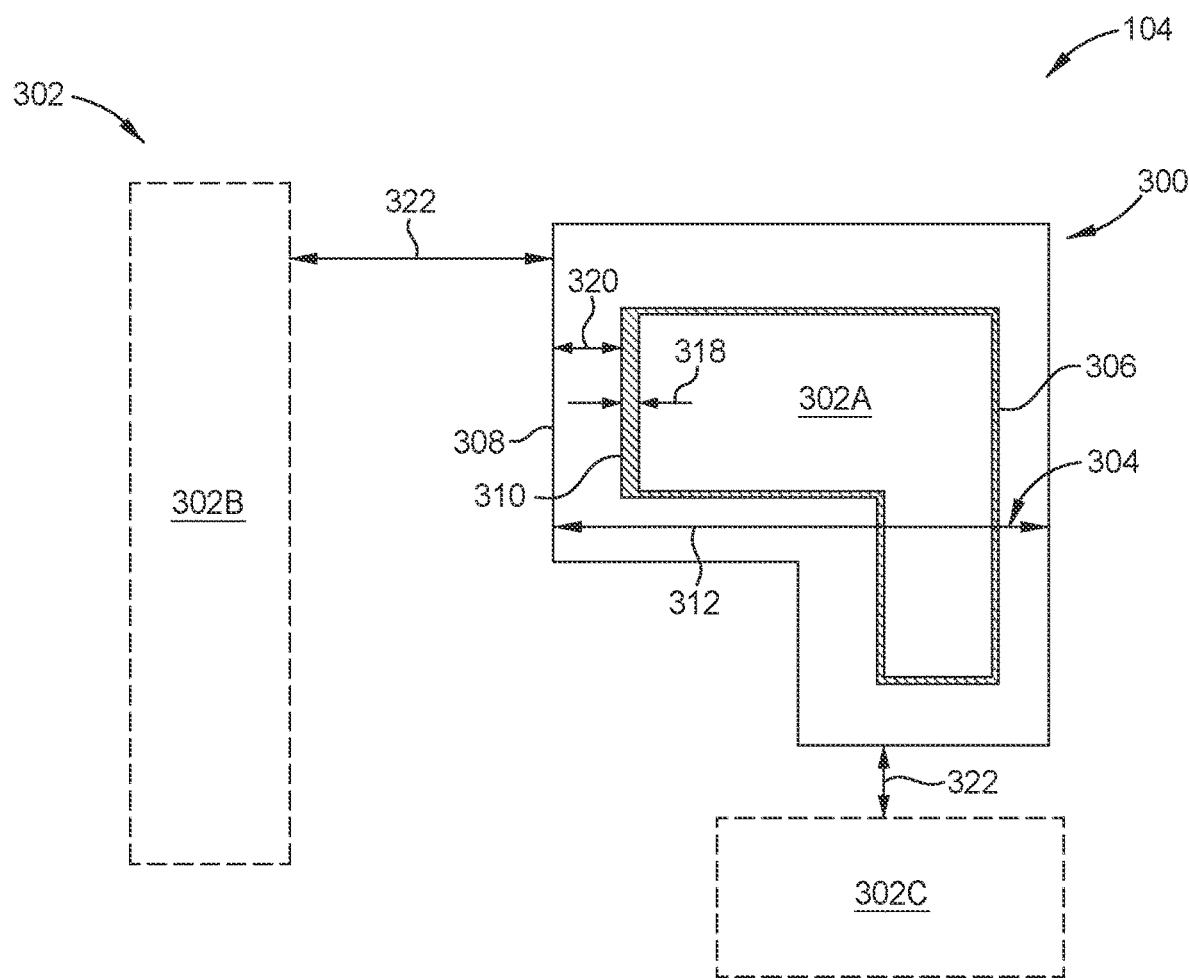
FIGS. 3A and 3B are schematic views of a double exposure pattern of a digital pattern file according to embodiments described herein.

FIG. 3A is a schematic view of a double exposure pattern 300 of a digital pattern file 104. The double exposure pattern 300 is designed to enlarge an intensity log-slope (ILS) and depth-of-focus of features formed in a photoresist of a substrate 220 (shown in FIG. 2). The digital pattern file 104 may include one or more polygons 302A-302C. For example, FIG. 3A shows a first polygon 302A, a second polygon 302B, and a third polygon 302C. The one or more polygons 302A-302C correspond to portions of the photoresist to be exposed to electromagnetic radiation projected by a processing unit 204 (shown in FIG. 2). Improving the ILS of features to be formed in a photoresist that correspond to the one or more polygons 302A-302C of the digital pattern file 104 will improve the resolution limitations of one or more image projection systems 206 (shown in FIG. 2).

Figure 3B:
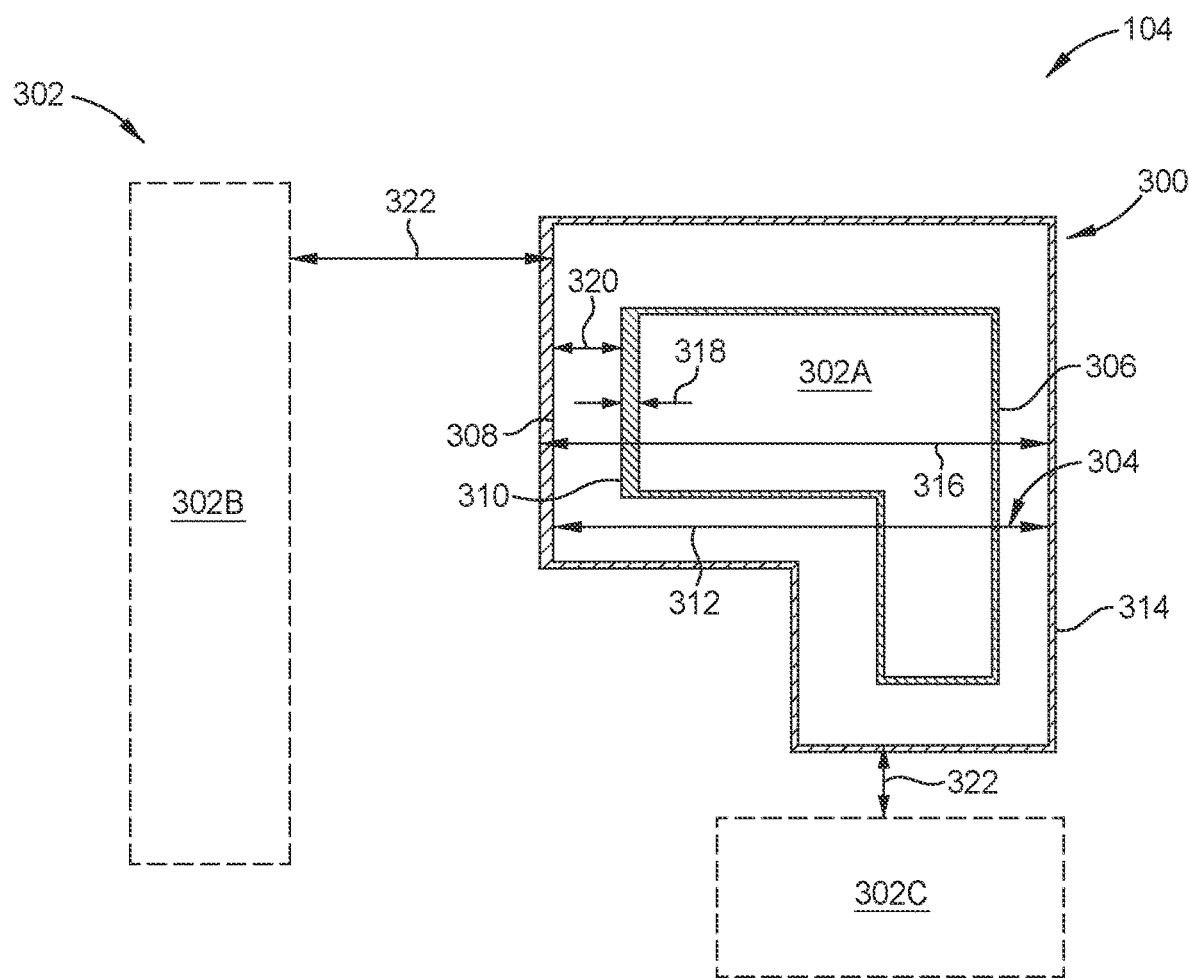

The first polygon 302A includes the double exposure pattern 300. To facilitate explanation, the second polygon 302B and the third polygon 302C are shown in phantom to explain the double exposure pattern 300 of the first polygon 302A. However, the second polygon 302B and the third polygon 302C may also include a double exposure pattern 300. Although only three polygons 302A-302C are shown in FIGS. 3A and 3B, the number of polygons 302 are not limited. It is to be understood that any shaped polygons could be used for the one or more polygons 302A-302C, such that the double exposure pattern 300 form one or more different features in the photoresist. The double exposure pattern 300 is applicable to be utilized on all pattern types as well as bright and dark field exposures.

The first polygon 302A includes a first exposure pattern 304 and a second exposure pattern 306. The first exposure pattern 304 includes the main pattern to be printed. In order to improve the intensity log-slope (ILS) and the depth-of-focus of the first exposure pattern 304, the second exposure pattern 306 is added. The second exposure pattern 306 is included such that the energy landing on a specific location on the substrate 220 during the lithography process is the sum of the first exposure pattern 304 and the second exposure pattern 306. The ILS corresponds to the fidelity of the features and the process window of the printing process. For example, a lower ILS corresponds to a smaller process window. The ILS is improved when a second exposure edge 310 of the second exposure pattern 306 runs parallel with a first exposure edge 308 of the first exposure pattern 304, as shown in FIG. 3A. In some embodiments, which can be combined with other embodiments described herein, the second exposure edge 310 of the second exposure pattern 306 is not parallel with the first exposure edge 308 of the first exposure pattern 304.

The second exposure pattern 306 includes a width 318 and a position 320. The width 318 of the second exposure pattern 306 may be different along different second exposure edges 310. In some embodiments, which can be combined with other embodiments described herein, increasing the width 318 of the second exposure edges 310 increases the ILS. Each second exposure edge 310 is parallel to a corresponding first exposure edge 308. The position 320 of the second exposure pattern 306 is defined as the distance between the second exposure edge 310 and the corresponding first exposure edge 308.

In one embodiment, which can be combined with other embodiments described herein, the width 318 and the position 320 of the second exposure pattern 306 are refined based on a critical dimension 312 of the first exposure pattern 304, polygon spacing 322, and/or orientation of the first exposure pattern 304. The critical dimension 312 of the first exposure pattern 304 will affect the position 320 of each of the second exposure edges 310 of the second exposure pattern 306. For example, in order to refine the ILS, the position 320 of each of the second exposure edges 310 will be positioned within the first exposure pattern 304 based partially on the critical dimension 312. The polygon spacing 322 is defined as the distance between adjacent polygons 302. For example, as shown in FIG. 3A, the polygon spacing 322 between the first polygon 302A and the second polygon 302B is larger than the polygon spacing 322 between the first polygon 302A and the third polygon 302C. Additionally, the orientation of the first exposure pattern 304 may affect the position 320 and/or the width 318 of the second exposure pattern 306. As the DMD is not circularly symmetric, vertical first exposure patterns 304 will be printed differently from a 45-degree oriented first exposure pattern 304 due to how the features are quantized by the DMD.

FIG. 3B is a schematic view of a double exposure pattern 300 of a digital pattern file 104. FIG. 3B shows the first exposure pattern 304 of the double exposure pattern 300 with a pattern bias 314. Due to the summation of the first exposure pattern 304 and the second exposure pattern 306, the critical dimension 312 of the first exposure pattern 304 will increase due to an increase in total energy. To compensate for the increase of the critical dimension 312, the pattern bias 314 will be implemented on the first exposure pattern 304. As shown in FIG. 3B, the pattern bias 314 is a negative bias and is applied to the first exposure pattern 304 such that a biased critical dimension 316 is smaller than the critical dimension 312. Therefore, the biased critical dimension 316 will expand to the critical dimension 312 during the lithography process. The pattern bias 314 enables the critical dimension 312 to be achieved after the second exposure pattern 306 is exposed. The pattern bias 314 can be refined through simulation or experiment.

Figure 4:
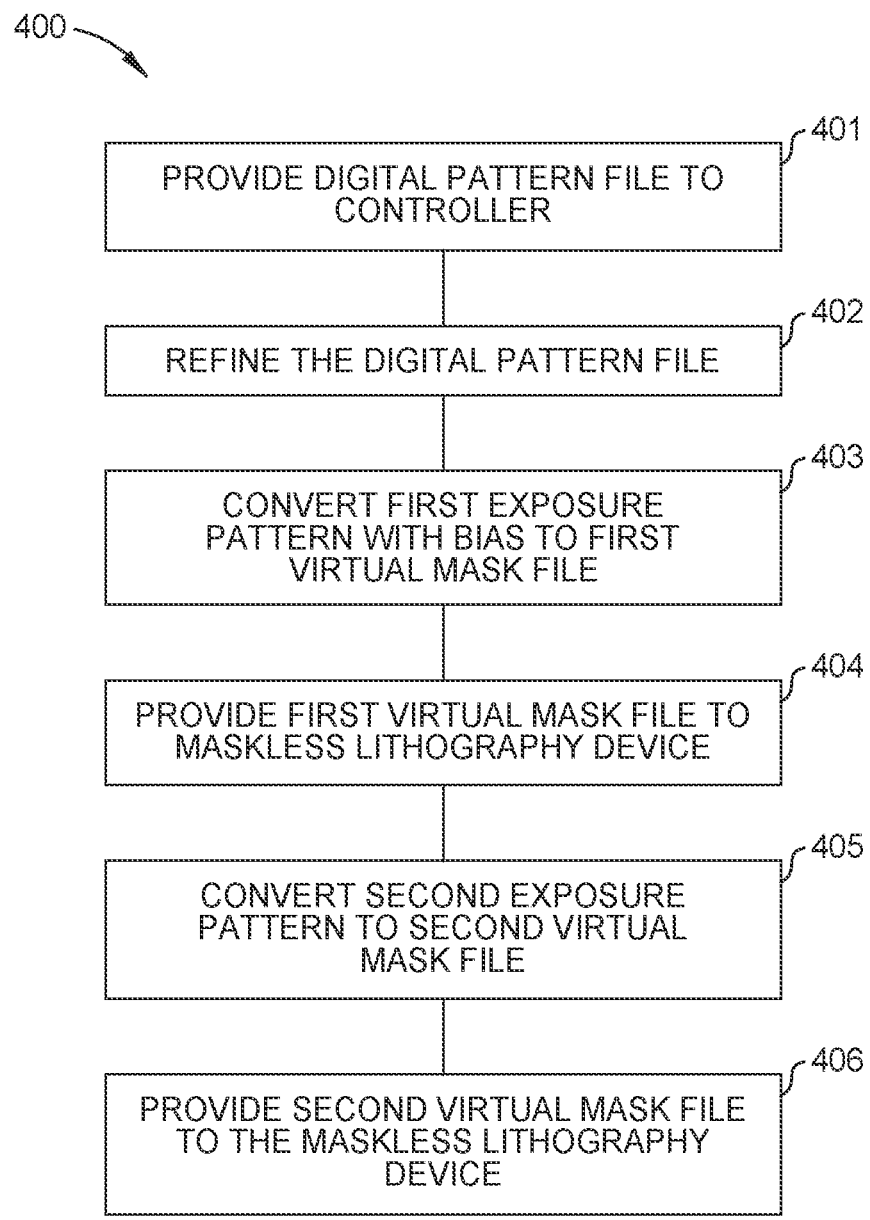
FIG. 4 is a flow diagram of a method for performing a rule-based double exposure according to embodiments described herein.
Figure 5:
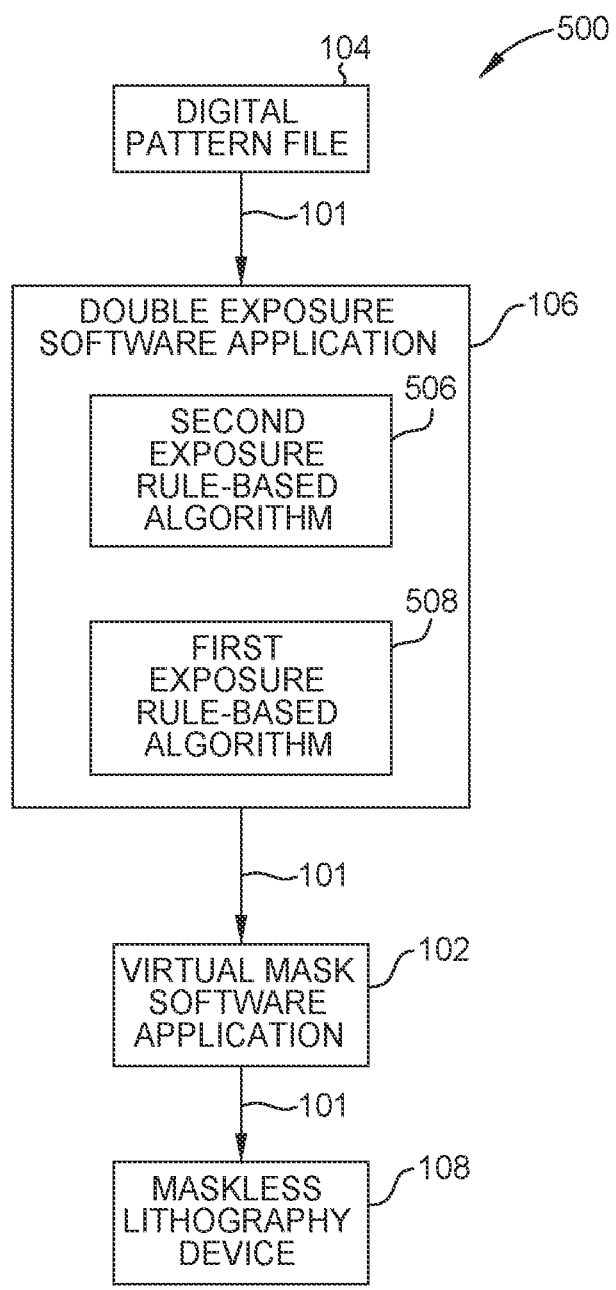
FIG. 5 is a schematic view of a rule-based process flow according to embodiments described herein.

FIG. 4 is a flow diagram of a method 400 for performing a rules based double exposure as shown in FIG. 5. FIG. 5 is a schematic view of a rule-based process flow 500. FIG. 5 includes elements of the lithography environment 100 shown in FIG. 1. To facilitate explanation, the method 400 will be described with reference to the rule-based process flow 500 of FIG. 5 and the double exposure pattern 300 of FIGS. 3A and 3B. In one embodiment, which can be combined with other embodiments described herein, the method 400 may be utilized with any lithography process and any maskless lithography device.

At operation 401, a digital pattern file 104 is provided to a controller 110. The controller 11 is operable to execute a double exposure software application 106. The digital pattern file 104 corresponds to a pattern to be written into a photoresist using electromagnetic radiation output by the maskless lithography device 108 (shown in FIG. 2). The digital pattern file 104 may include areas of interest which correspond to one or more structural elements. The structural elements may be constructed as geometrical shapes, such as polygons (e.g., polygons 302A-302C shown in FIGS. 3A-3B). The digital pattern file 104 initially defines a first exposure pattern 304 (shown in FIGS. 3A-3B).

At operation 402, the digital pattern file 104 is refined with the double exposure software application 106. The digital pattern file 104 is refined to determine the position 320 and width 318 of a second exposure pattern 306 and a pattern bias 314 of the first exposure pattern 304. The digital pattern file 104 is refined to improve the intensity-log-slope (ILS) and the depth of focus of features to be formed on the photoresist in a lithography process. In one embodiment, which can be combined with other embodiments described herein, the ILS is specifically refined along first exposure edges 308 of the first exposure pattern 304. The double exposure software application 106 determines the second exposure pattern 306 based on a second exposure rule-based algorithm 506. The second exposure rule-based algorithm 506 utilizes a lookup table to refine the exposure patterns of the digital pattern file 104.

As described above, the lookup table may be constructed by categorizing different first exposure patterns 304 of the digital pattern file 104 into groups and applying different second exposure patterns 306 to each first exposure pattern 304, and thereafter determining and correlating resulting ILS and/or depth of focus values. For example, for repeating first exposure patterns 304, the first exposure patterns 304 can be categorized by the critical dimension 312 and the relative position of the first exposure patterns 304. For each first exposure pattern 304, variables such as the position 320 and the width 318 of the second exposure pattern 306 within first exposure patterns 304, and the pattern bias 314 are determined empirically by printing different combinations of these variables. The results that maximize the intensity log-slope (ILS) and depth-of-focus of features formed in a photoresist of a substrate based on the digital pattern file 104 are recorded as one row in the lookup table. The process is repeated for different first exposure patterns 304 to complete the table. The process can be further extended to describe non-1D first exposure patterns 304.

In operation, when the lookup table is constructed, the double exposure software application 106 analyzes each first exposure pattern 304 on the digital pattern file 104 and determines the critical dimension 312 and the polygon spacing 322. If there are different critical dimensions 312 or polygon spacing 322 along a first exposure edge 308, the edge is broken into segments with constant critical dimensions 312 and polygon spacing 322. The double exposure software application 106 references the lookup table to determine the position 320 and the width 318 of the second exposure patterns 306 based on inputs of the critical dimension 312 and the polygon spacing 322.

In embodiments where the first exposure patterns 304 are not repeated, the lookup table can be expanded to include the critical dimension 312 of the adjacent first exposure pattern 304 as the 3rd input value (3rd attribute) to the lookup table. For example, a first exposure pattern 304 with a critical dimension 312 of 2 μm is adjacent to a first exposure pattern 304 with a critical dimension 312 of 4 μm. As the first exposure patterns 304 become more complicated, more input attributes can be added to better describe the first exposure patterns 304.

The double exposure software application 106 utilizes the lookup table to determine the pattern bias 314. The double exposure software application 106 determines the pattern bias 314 of the first exposure pattern 304 based on a first exposure rule-based algorithm 508. The lookup table database includes empirical data relating to the biasing required to maintain a critical dimension 312 for the first exposure pattern 304 based on the position 320 and the width 318 of the second exposure pattern 306.

The second exposure rule-based algorithm 506 and the first exposure rule-based algorithm 508 references the lookup table database to determine a position 320 and a width 318 of a second exposure pattern 306 that maximizes an intensity log-slope (ILS) and depth-of-focus of features formed in a photoresist of a substrate based on the digital pattern file 104. The second exposure rule-based algorithm 506 and first exposure rule-based algorithm 508 also ensure that the second exposure pattern 306 is confined within the first exposure pattern 304. The second exposure rule-based algorithm 506 and first exposure rule-based algorithm 508 also ensures that the pattern bias 314 is applied such that the first exposure pattern 304 is within tolerances of the desired pattern based on the digital pattern file 104. In one embodiment, which can be combined with other embodiments described herein, the ILS is specifically refined along first exposure edges 308 of the first exposure pattern 304. The second exposure pattern 306 of one or more polygons 302A-302C of the digital pattern file 104 may be determined.

At operation 403, the first exposure pattern 304 with the pattern bias 314 is provided to a virtual mask software application 102. The virtual mask software application 102 converts the first exposure pattern 304 of the one or more polygons 302A-302C within the digital pattern file 104 to one or more quadrilateral polygons to generate a first virtual mask file. The first virtual mask file is a digital representation of the first exposure pattern 304 to be printed by the maskless lithography device 108.

At operation 404, the first virtual mask file is provided to the maskless lithography device 108. The maskless lithography device 108 performs a lithography process to expose a substrate to the first exposure pattern included in the first virtual mask file. Optionally, after the lithography process of operation 404, the substrate may be further processed, for example by development of the photoresist and/or etching, to form a pattern on the substrate.

At operation 405, the second exposure pattern 306 is provided to a virtual mask software application 102. The virtual mask software application 102 converts the second exposure pattern 306 of the one or more polygons 302A-302C within the digital pattern file 104 to one or more quadrilateral polygons to generate a second virtual mask file.

The second virtual mask file is a digital representation of the second exposure pattern 306 to be printed by the maskless lithography device 108.

At operation 406, the second virtual mask file is provided to the maskless lithography device 108. The maskless lithography device 108 performs a lithography process to expose a substrate to the second exposure pattern 306 included in the first virtual mask file. The second exposure pattern 306 is added to the first exposure pattern 304 to form a double exposure pattern (e.g., the double exposure pattern 300 of FIGS. 3A and 3B). Optionally, after the lithography process of operation 404, the substrate may be further processed, for example by development of the photoresist and/or etching, to form a pattern on the substrate. The summation of the first exposure pattern 304 and the second exposure pattern 306 increases the intensity log-slope and depth-of-focus of the features formed on the photoresist of the substrate. Thus, the resolution and the process window of the maskless lithography device 108 are improved.

Figure 6:
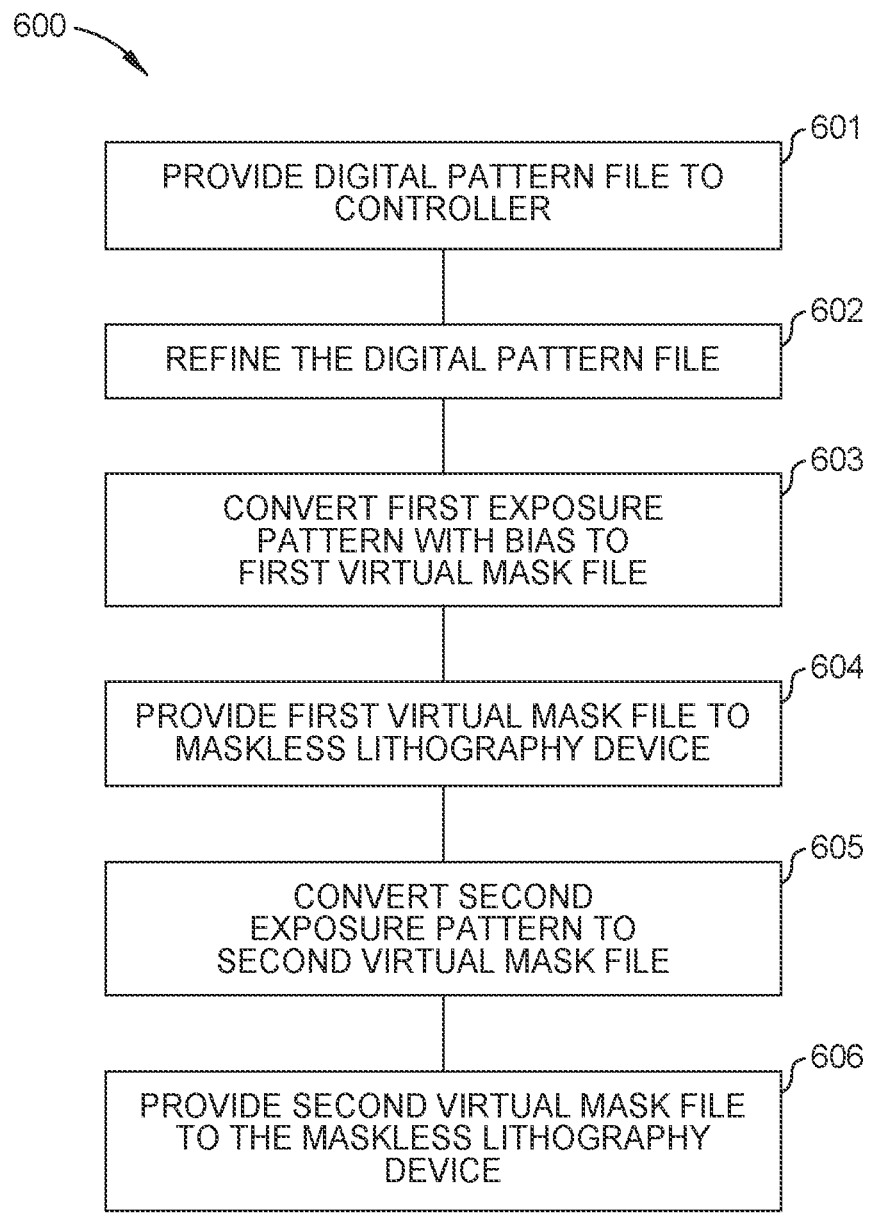
FIG. 6 is a flow diagram of a method for performing a model based double exposure according to embodiments described herein.
Figure 7:
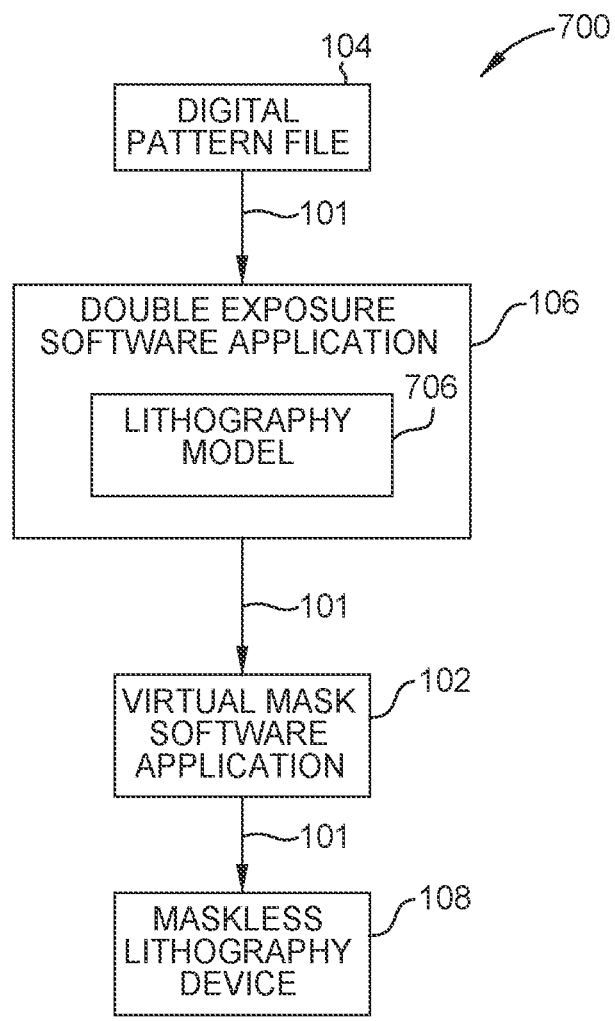
FIG. 7 is a schematic view of a model-based process flow according to embodiments described herein.

FIG. 6 is a flow diagram of a method 600 for performing a model based double exposure as shown in FIG. 7. FIG. 7 is a schematic view of a model based process flow 700. FIG. 7 includes elements of the lithography environment 100 shown in FIG. 1. To facilitate explanation, the method 600 will be described with reference to the model based process flow 700 of FIG. 7 and the double exposure pattern 300 of FIGS. 3A and 3B. In one embodiment, which can be combined with other embodiments described herein, the method 600 may be utilized with any lithography process and any maskless lithography device.

At operation 601, a digital pattern file 104 is provided to a controller 110. The controller 110 is operable to execute a double exposure software application 106. The digital pattern file 104 corresponds to a pattern to be written into a photoresist using electromagnetic radiation output by the maskless lithography device 108 (shown in FIG. 2). The digital pattern file 104 may include areas of interest which correspond to one or more structural elements. The structural elements may be constructed as geometrical shapes, such as polygons (e.g., polygons 302A-302C shown in FIGS. 3A-3B). The digital pattern file 104 includes a first exposure pattern 304 (shown in FIGS. 3A-3B).

At operation 602, the digital pattern file 104 is refined with the double exposure software application 106. The digital pattern file 104 is refined to determine the position 320 of a second exposure pattern 306, width 318 of a second exposure pattern 306, and a pattern bias 314 of the first exposure pattern 304. The digital pattern file 104 is refined to improve the intensity-log-slope (ILS) of features to be formed on a photoresist in a lithography process. In one embodiment, which can be combined with other embodiments described herein, the ILS is specifically refined along first exposure edges 308 of the first exposure pattern 304.

The second exposure pattern 306 and the pattern bias 314 of the first exposure pattern 304 are determined based on a lithography model 706. The lithography model 706 is operable to predict the position 320 and width 318 of the second exposure pattern 306 and predict the pattern bias 314 of the first exposure pattern 304. The lithography model is constructed to be defined based on optical properties (e.g., optical properties relating to the maskless lithography device 108) and the photoresist properties (e.g., properties of the photoresist of which the pattern will be printed on such as materials and processing characteristics of the photoresist).

Upon construction of the lithography model, the digital pattern file 104 is input to the lithography model. The lithography model will then predict and adjust variables to output a prediction of the aerial image and resist profile of the digital pattern file 104. Through post-processing steps, the ILS and depth of focus of features formed in a photoresist of a substrate based on the digital pattern file 104 may be determined. The variables includes a width 318 and position 320 of the second exposure pattern 306 (shown in FIGS. 3A and 3B) and a pattern bias value of the first exposure pattern 304 (shown in FIG. 3B). The variables are predicted by the lithography model such that the ILS is increased, the depth of focus is increased, desired dimensions for the first exposure patterns 304 are maintained, and no extra patterns are printed.

The variables are adjusted according to the lithography model 706 or other rules of the double exposure software application 106 until a threshold intensity log-slope (ILS) and/or depth-of-focus of features are achieved. The lithography model 706 may also consider Additionally or alternatively, the double exposure software application 106 refines the digital pattern file 104 by adjusting the variables of the digital pattern file 104 according to the lithography model 706 or other rules of the double exposure software application 106 until a maximum intensity log-slope (ILS) and/or depth-of-focus of features are achieved. In one embodiment, which can be combined with other embodiments described herein, the ILS is specifically refined along first exposure edges 308 of the first exposure pattern 304.

The double exposure software application 106 may predict the position 320 of the second exposure pattern 306, the width 318 of the second exposure pattern 306, and the pattern bias 314 simultaneously within the double exposure software application 106. The double exposure software application 106 predicts the pattern bias 314 required to maintain a critical dimension 312 for the first exposure pattern 304 based on the position 320 and the width 318 of the second exposure pattern 306.

The lithography model 706 ensures that the pattern bias 314 is determined such that the first exposure pattern 304 are within tolerances of the desired pattern based on the digital pattern file 104. The lithography model 706 also ensures that the second exposure pattern 306 are confined within the first exposure pattern 304.

At operation 603, the first exposure pattern 304 with the pattern bias 314 is provided to a virtual mask software application 102. The virtual mask software application 102 converts the first exposure pattern 304 of the one or more polygons 302A-302C within the digital pattern file 104 to one or more quadrilateral polygons to generate a first virtual mask file. The first virtual mask file is a digital representation of the first exposure pattern 304 to be printed by the maskless lithography device 108.

At operation 604, the first virtual mask file is provided to the maskless lithography device 108. The maskless lithography device 108 performs a lithography process to expose a substrate to the first exposure pattern included in the first virtual mask file. Optionally, after the lithography process of operation 404, the substrate may be further processed, for example by development of the photoresist and/or etching, to form a pattern on the substrate.

At operation 605, the second exposure pattern 306 is provided to a virtual mask software application 102. The virtual mask software application 102 converts the second exposure pattern 306 of the one or more polygons 302A-302C within the digital pattern file 104 to one or more quadrilateral polygons to generate a second virtual mask file. The second virtual mask file is a digital representation of the second exposure pattern 306 to be printed by the maskless lithography device 108.

At operation 606, the second virtual mask file is provided to the maskless lithography device 108. The maskless lithography device 108 performs a lithography process to expose a substrate to the second exposure pattern 306 included in the second virtual mask file. The second exposure pattern 306 is added to the first exposure pattern 304 to form a double exposure pattern (e.g., the double exposure pattern 300 of FIGS. 3A and 3B). Optionally, after the lithography process of operation 404, the substrate may be further processed, for example by development of the photoresist and/or etching, to form a pattern on the substrate. The summation of the first exposure pattern 304 and the second exposure pattern 306 increases the intensity log-slope and depth-of-focus of features formed on a photoresist of the substrate. Thus, the resolution and the process window of the maskless lithography device 108.

Figure 8:
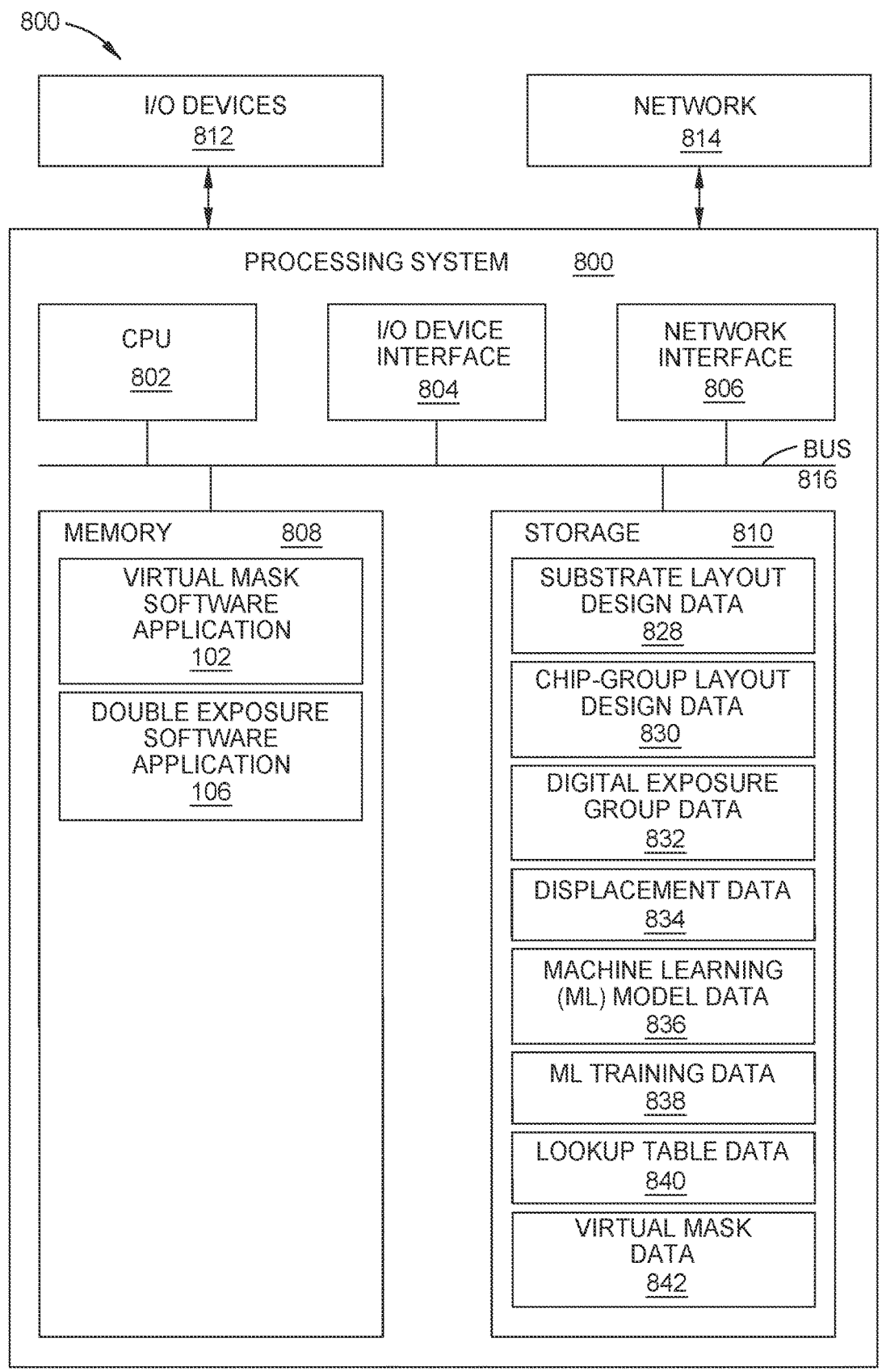
FIG. 8 depicts a processing system according to embodiments described herein.

FIG. 8 depicts a processing system 800, according to certain embodiments. Processing system 800 is an example of controller 110, according to certain embodiments, and may be used in place of controller 110 described above. FIG. 8 depicts an example processing system 800 that may operate embodiments systems described herein to perform embodiments according to the flow diagrams and methods described herein, such as the method for performing a rules based double exposure as described with respect to FIGS. 4 and 5 and the method for performing a model based double exposure described with respect to FIGS. 6 and 7.

Processing system 800 includes a central processing unit (CPU) 802 connected to a data bus 816. CPU 802 is configured to process computer-executable instructions, e.g., stored in memory 808 or storage 810, and to cause the processing system 800 to perform embodiments of methods described herein on embodiments of systems described herein, for example with respect to FIGS. 1-7. CPU 802 is included to be representative of a single CPU, multiple CPUs, a single CPU having multiple processing cores, and other forms of processing architecture capable of executing computer-executable instructions.

Processing system 800 further includes input/output (I/O) device(s) 812 and interfaces 804, which allows processing system 800 to interface with input/output devices 812, such as, for example, keyboards, displays, mouse devices, pen input, and other devices that allow for interaction with processing system 800. Note that processing system 800 may connect with external I/O devices through physical and wireless connections (e.g., an external display device).

Processing system 800 further includes a network 814 interface, which provides processing system with access to external network 814 and thereby external computing devices.

Processing system 800 further includes memory 808, which in this example includes a virtual mask software application 102 and a double exposure software application 106 for performing operations described herein, for example as described in connection with FIGS. 4 and 6.

Note that while shown as a single memory 808 in FIG. 8 for simplicity, the various aspects stored in memory 808 may be stored in different physical memories, including memories remote from processing system 800, but all accessible by CPU 802 via internal data connections such as bus 816.

Storage 810 further includes substrate layout design data 828, chip-group layout design data 830, digital exposure group data 832, displacement data 834, machine learning (ML) model data 836 (i.e., lithography model data), ML training data 838, lookup table data 840, and virtual mask data 842, for performing operations described herein. As would be appreciated by one of ordinary skill, other data and aspects may be included in storage 810.

As with memory 808, a single storage 810 is depicted in FIG. 8 for simplicity, but various aspects stored in storage 810 may be stored in different physical storages, but all accessible to CPU 802 via internal data connections, such as bus 816, or external connection, such as network interfaces 806. One of skill in the art will appreciate that one or more elements of processing system 800 may be located remotely and accessed via a network 814.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a c c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more operations or actions for achieving the methods. The method operations and/or actions may be interchanged with one another without departing from the scope of the claims. In other words, unless a specific order of operations or actions is specified, the order and/or use of specific operations and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

In summation, methods of printing double exposure patterns in a lithography environment are described herein. The methods include determining a second exposure pattern to be exposed with a first exposure pattern in a lithography process. The second exposure pattern is determined with a rule-based process flow or a lithography model process flow. Additionally, a bias for the first exposure pattern may be implemented to compensate for variations of critical dimensions of the first exposure pattern due to the second exposure pattern. The double exposure pattern is formulated by a double exposure pattern software application such that an intensity log-slope and depth-of-focus are improved for features to be formed in a photoresist based on the double exposure pattern. Therefore, the double exposure patterns are operable to improve resolution and the process window of a maskless lithography device utilized in the lithography process. The double exposure patterns are a software based solution and thus can be utilized quickly and cost effectively to improve the resolution and the process window.

While the foregoing is directed to examples of the present disclosure, other and further examples of the disclosure may be devised without departing from the basic scope thereof, and the scope thereof is determined by the claims that follow.

What is claimed is:

1. A method, comprising:
receiving data defining a first exposure pattern for a lithographic process, the first exposure pattern including one or more polygons and the lithographic process including exposure using at least two spatial light modulators of at least two image projection systems of a processing unit, the processing unit is a pattern generator configured to receive a first virtual mask file and a second virtual mask file;
determining a position and a width of a second exposure pattern based on the data defining the first exposure pattern, the second exposure pattern confined within the first exposure pattern;
determining a pattern bias to be applied for the first exposure pattern during the lithographic process, the pattern bias of the first exposure pattern determined based on the position and the width of the second exposure pattern;
converting the data of the first exposure pattern and the data indicating the pattern bias to the first virtual mask file;
patterning a substrate using the first virtual mask file in a maskless lithography device including the processing unit, the processing unit receiving the first virtual mask file, and the substrate patterned by exposing the substrate to light modulated from the at least two spatial light modulators of the at least two image projection systems;
converting the data of the second exposure pattern to the second virtual mask file; and
patterning the substrate in the maskless lithography device using the second virtual mask file including the processing unit, the processing unit receiving the second virtual mask file, and the substrate patterned by exposing the substrate to light modulated from the at least two spatial light modulators of the at least two image projection systems.

2. The method of claim 1, wherein the determining the position and the width of the second exposure pattern includes referencing a lookup table database, the lookup table database including empirical data relating to the first exposure pattern.

3. The method of claim 2, wherein the lookup table database determines the position and the width of the second exposure pattern based on a maximum of one or both of an intensity log-slope (ILS) and depth-of-focus of features formed in a photoresist of a substrate based on the data.

4. The method of claim 1, wherein the determining the pattern bias includes referencing a lookup table database, the lookup table database including empirical data relating to biasing for maintaining a predefined critical dimension for the first exposure pattern.

5. The method of claim 1, further comprising processing the substrate by developing or etching the substrate to form a pattern on the substrate.

6. The method of claim 1, wherein the converting the data of the first exposure pattern and the data indicating the pattern bias to the first virtual mask file includes converting each of the one or more polygons within the data to one or more quadrilateral polygons to generate the first virtual mask file.

7. The method of claim 1, wherein the converting the data of the second exposure pattern and the data indicating the pattern bias to the first virtual mask file includes converting each of the one or more polygons within the data to one or more quadrilateral polygons to generate the second virtual mask file.

8. The method of claim 1, wherein the pattern bias of the first exposure pattern is a negative bias.

9. A method comprising,
receiving data defining a first exposure pattern for a lithographic process, the first exposure pattern including one or more polygons;
determining a position and a width of a second exposure pattern based on the data defining the first exposure pattern;
determining a pattern bias to be applied for the first exposure pattern during the lithographic process, the pattern bias of the first exposure pattern determined based on the position and the width of the second exposure pattern;
converting the data of the first exposure pattern and the data indicating the pattern bias to a first virtual mask file;

patterning a substrate using the first virtual mask file in a maskless lithography device;
converting the data of the second exposure pattern to a second virtual mask file; and
patterning the substrate in the maskless lithography device using the second virtual mask file, wherein the determining the position and the width of the second exposure pattern includes referencing a lookup table database, the lookup table database including empirical data relating to the first exposure pattern, the lookup table database determines the position and the width of the second exposure pattern based on a maximum of one or both of an intensity log-slope (ILS) and depth-of-focus of features formed in a photoresist of a substrate based on the data, and wherein the lookup table database determines the position and the width of the second exposure pattern such that the second exposure pattern is confined within the first exposure pattern.

10. A method, comprising:
receiving data defining a first exposure pattern for a lithographic process, the first exposure pattern including one or more polygons and the lithographic process including exposure using at least two spatial light modulators of at least two image projection systems of a processing unit, the processing unit is a pattern generator configured to receive a first virtual mask file and a second virtual mask file;
inputting the data to a lithography model constructed to predict an aerial image and resist profile based on the data;
determining a position and a width of a second exposure pattern that is confined within the first exposure pattern using numerical calculations to solve the lithography model, wherein the position and the width correspond to a maximum intensity log-slope (ILS) or depth-of-focus of features formed in a photoresist of a substrate based on the data;
determining a pattern bias to be applied for the first exposure pattern during the lithographic process, the pattern bias of the first exposure pattern determined using numerical calculations to solve the lithography model, wherein the pattern bias corresponds to a maximum ILS or depth-of-focus of the features formed in the photoresist of the substrate based on the data;
converting the data of the first exposure pattern and the data indicating the pattern bias to the first virtual mask file;
patterning a substrate using the first virtual mask file in a maskless lithography device including the processing unit, the processing unit receiving the first virtual mask file, and the substrate patterned by exposing the substrate to light modulated from the at least two spatial light modulators of the at least two image projection systems;
converting the data of the second exposure pattern to the second virtual mask file; and
patterning the substrate in the maskless lithography device using the second virtual mask file including the processing unit, the processing unit receiving the second virtual mask file, and the substrate patterned by exposing the substrate to light modulated from the at least two spatial light modulators of the at least two image projection systems.

11. The method of claim 10, wherein the determining the position of the second exposure pattern, the width of the second exposure pattern, and the pattern bias includes providing the data to the lithography model of a double exposure pattern software application, the double exposure pattern software application operable to simultaneously predict the position of the second exposure pattern, the width of the second exposure pattern, and the pattern bias.

12. The method of claim 11, wherein the double exposure pattern software application predicts the pattern bias required to maintain a critical dimension for the first exposure pattern based on the position and the width of the second exposure pattern.

13. The method of claim 10, further comprising processing the substrate by developing or etching the substrate to form a pattern on the substrate.

14. The method of claim 10, wherein the converting the data of the first exposure pattern and the data indicating the pattern bias to the first virtual mask file includes converting each of the one or more polygons within the data to one or more quadrilateral polygons to generate the first virtual mask file.

15. The method of claim 10, wherein the converting the data of the second exposure pattern and the data indicating the pattern bias to the first virtual mask file includes converting each of the one or more polygons within data file to one or more quadrilateral polygons to generate the second virtual mask file.

16. A method comprising:
receiving data defining a first exposure pattern for a lithographic process, the first exposure pattern including one or more polygons;
determining a position and a width of a second exposure pattern based on the data defining the first exposure pattern;
determining a pattern bias to be applied for the first exposure pattern during the lithographic process, the pattern bias of the first exposure pattern determined based on the position and the width of the second exposure pattern;
converting the data of the first exposure pattern and the data indicating the pattern bias to a first virtual mask file;
patterning a substrate using the first virtual mask file in a maskless lithography device;
converting the data of the second exposure pattern to a second virtual mask file; and
patterning the substrate in the maskless lithography device using the second virtual mask file, wherein the second exposure pattern is confined within the first exposure pattern.

17. A system, comprising:
a moveable stage configured to support a substrate having a photoresist disposed thereon; and
a processing unit disposed over the moveable stage configured to print a first virtual mask file and a second virtual mask file provided by a controller in communication with the processing unit, wherein the controller is configured to:
receive data defining a first exposure pattern for a lithographic process, the first exposure pattern including one or more polygons and the lithographic process including exposure using at least two spatial light modulators of at least two image projection systems of the processing unit;
determine a position and a width of a second exposure pattern based on the data defining the first exposure pattern that is confined within the first exposure pattern;
determine a pattern bias to be applied for the first exposure pattern during the lithographic process, the pattern bias of the first exposure pattern determined based on the position and the width of the second exposure pattern;
convert the data of the first exposure pattern and the data indicating the pattern bias to the first virtual mask file;
pattern a substrate using the first virtual mask file with the processing unit, the processing unit receiving the first virtual mask file, and the substrate patterned by exposing the substrate to light modulated from the at least two spatial light modulators of the at least two image projection systems;
convert the data of the second exposure pattern to the second virtual mask file; and
pattern the substrate with the processing unit using the second virtual mask file, the processing unit receiving the second virtual mask file, and the substrate patterned by exposing the substrate to light modulated from the at least two spatial light modulators of the at least two image projection systems.

18. The system of claim 17, wherein the controller is further configured to process the substrate by developing or etching the substrate to form a pattern on the substrate.

19. The system of claim 17, wherein the controller is further configured to reference a lookup table database, the lookup table database including empirical data relating to the first exposure pattern.

20. A system comprising;
a moveable stage configured to support a substrate having a photoresist disposed thereon; and
a processing unit disposed over the moveable stage configured to print a first virtual mask file and a second virtual mask file provided by a controller in communication with the processing unit, wherein the controller is configured to:
receive data defining a first exposure pattern for a lithographic process, the first exposure pattern including one or more polygons;
determine a position and a width of a second exposure pattern based on the data defining the first exposure pattern;
determine a pattern bias to be applied for the first exposure pattern during the lithographic process, the pattern bias of the first exposure pattern determined based on the position and the width of the second exposure pattern;
convert the data of the first exposure pattern and the data indicating the pattern bias to the first virtual mask file;
pattern a substrate using the first virtual mask file with the processing unit;
convert the data of the second exposure pattern to the second virtual mask file; and
pattern the substrate with the processing unit using the second virtual mask file, wherein the second exposure pattern is confined within the first exposure pattern.

* * * * *